(12) United States Patent
Austin et al.

(10) Patent No.: US 7,068,115 B2
(45) Date of Patent: Jun. 27, 2006

(54) MONOLITHIC MICROWAVE INTEGRATED CIRCUIT VOLTAGE CONTROLLED COUPLED FEEDBACK OSCILLATOR

(75) Inventors: Zahilya Austin, St. Paul, MN (US); Timothy T. Childs, Eden Prairie, MN (US); Sasidhar Vajha, Minneapolis, MN (US)

(73) Assignee: TLC Precision Wafer Technology, Inc., Minneapolis, MN (US)

( * ) Notice: Subject to any disclaimer, the term of this patent is extended or adjusted under 35 U.S.C. 154(b) by 154 days.

(21) Appl. No.: 10/662,748

(22) Filed: Sep. 15, 2003

(65) Prior Publication Data

US 2004/0061565 A1 Apr. 1, 2004

Related U.S. Application Data

(60) Provisional application No. 60/410,762, filed on Sep. 13, 2002.

(51) Int. Cl.
*H03B 5/12* (2006.01)
(52) U.S. Cl. .................. 331/107 SL; 331/107 DP; 331/177 V; 331/96; 331/99; 331/177 R
(58) Field of Classification Search .......... 331/76, 331/99, 107 SL, 107 DP, 108 C, 177 R, 331/177 V, 96; 333/17.1, 246, 247
See application file for complete search history.

(56) References Cited

U.S. PATENT DOCUMENTS

| | | | |
|---|---|---|---|
| 4,518,931 A | 5/1985 | Rauscher | |
| 4,949,053 A | 8/1990 | Havens et al. | |
| 5,546,056 A | 8/1996 | Tokumitsu | |
| 6,124,767 A | * | 9/2000 | Woods ............. 331/117 D |
| 6,208,214 B1 | 3/2001 | Geddes et al. | |
| 6,559,024 B1 | 5/2003 | Boles et al. | |

OTHER PUBLICATIONS

A. Boudiaf, M. Ahdjoudj, and P. Pouvil. Low Phase-Noise PHEMT-Based MMIC VCOs for LMDS Applications. *IEEE 2001 MTT-S Int'l. Symposium Digest*, vol. III, pp. 1559-1562.

P.J. McNally, T. Smith, F.R. Phelleps and K.M. Hogan. $K_u$- and K-Band GaAs MMIC Varacter-Tuned FET Oscillators Using MEV Ion-Implanted Burried-Layer Back Contacts. *IEEE 1990 Microwave and Millimeterwave Monolithic Circuits Symposium Digest*, pp. 107-110.

E. Reese, Jr. and J.M. Beall. Optimized X & $K_u$ Band GaAs MMIC Varactor Tuned FET Oscillators. *IEEE MTT-S International Microwave Symposium Digest*, vol. 1, pp. 487-490.

Bahman Meskoob et al: "Loop-Gain Measurement and Feedback Oscillator Design", *IEEE Microwave and Guided Wave Letters*, vol. 2, No. 9, Sep. 1992, 375-377.

* cited by examiner

*Primary Examiner*—Arnold Kinkead
(74) *Attorney, Agent, or Firm*—Kinney & Lange, P.A.

(57) ABSTRACT

A feedback oscillator device formed with an integrated circuit having a semiconductor material substrate on a ground plane. The circuit has an amplifier having an input and an output is provided at least in part on said semiconductor material substrate. A directional coupler is used to couple the amplifier output signal to the amplifier input through a parallel separated transmission lines transfer system and a capacitor such as a varactor. The substrate can be of gallium arsenide.

39 Claims, 5 Drawing Sheets

MONOLITHIC MICROWAVE INTEGRATED CIRCUIT VOLTAGE CONTROLLED COUPLED FEEDBACK OSCILLATOR

CROSS-REFERENCE TO RELATED APPLICATION(S)

This application claims the benefit of Provisional Application No. 60/410,762 filed Sep. 13, 2002 for "GaAs MILLIMETER WAVE MONOLITHIC MICROWAVE INTEGRATED VOLTAGE CONTROLLED OSCILLATORS"

BACKGROUND OF THE INVENTION

The present invention relates to electronic circuit oscillators and, more particularly, to electronic circuit oscillators which oscillate at millimeter wavelengths.

Oscillator circuits generate periodic electrical signals by converting a fraction of the constant polarity power supply thereto into a periodic signal output without requiring a period signal input. As such, oscillators at higher frequencies are millimeter wave and microwave energy sources for many kinds of high operating frequency systems. That is, oscillators at high frequencies are often precisely controlled frequency sources used in frequency conversions and in generating carriers for modulated signals in communication systems.

The advancements made in high frequency circuits and systems have increased the need for better performing oscillators. Some of the problems which arise from the use of high frequency oscillators are output signal amplitude stability and phase noise, i.e. variations in the oscillation frequency from the desired frequency, relatively large and costly oscillation systems because of the need for forming hybrid circuits requiring plural components mounted over an area in the device housing that requires interconnections, sometimes by hand, between those components, changing performance with changing temperatures, and reliability during use in many kinds of environments.

In addition, in many applications, the oscillator must be tunable with respect to the frequency of its output signal so that frequency can be varied by the user as desired. Additional problems which have been encountered in tunable oscillators are relatively narrow tuning frequency bandwidths, non-linear changes in the tuning frequency with the control variable, and long settling times for the output signal frequency and amplitude following a change made thereto by the tuning control variable. Thus, there is a desire for improved high frequency oscillators to reduce such problems, and particularly for high frequency tunable oscillators to reduce the added problems presented thereby.

BRIEF SUMMARY OF THE INVENTION

The present invention provides a feedback oscillator device formed with an integrated circuit having a semiconductor material substrate having a conductive ground plane on an equipotential major surface thereof on a side opposite an operating major surface thereof. An amplifier having an input and an output is provided at least in part on said semiconductor material substrate at the operating surface with the amplifier being capable of providing signals at the output thereof representative of signals occurring at the input thereof. A coupler having an oblong input conductor of a selected input length is provided on the operating surface of said semiconductor substrate electrically coupled at one end thereof to the amplifier output, and further having an oblong output conductor of a selected output length that is provided on the operating surface of the semiconductor substrate closely adjacent to the input conductor with the input length being substantially parallel to the output length. The output conductor is electrically coupled at one end thereof to the amplifier input.

A transfer system can be further provided to electrically couple the coupler output conductor to the amplifier input. This transfer system has an oblong input conductor of a selected input length provided on the operating surface of the semiconductor substrate electrically coupled substantially on the operating surface at one end thereof to the coupler output conductor but free of other connections on the opposite end thereof to other structures on the operating surface. This transfer system also has an oblong output conductor of a selected output length provided on the operating surface of the semiconductor substrate electrically coupled substantially on the operating surface at one end thereof to the amplifier input but free of other connections on the opposite end thereof to other structures on the operating surface.

A capacitor can be used to electrically couple said transfer system and coupler to the amplifier input. The amplifier comprises a transistor, and the semiconductor substrate is typically of gallium arsenide or, alternatively, other high mobility semiconductor material substrate. A buffer amplifier can be used with the oscillator.

DETAILED DESCRIPTION

Oscillator circuits capable of providing high frequency output signals have been implemented previously in using a variety of electronic devices. One-port negative resistance oscillators have used active devices which can be biased to result in having an impedance with a negative real part such as IMPATT diodes and Gunn diodes. These oscillators, however, are typically formed as hybrid modules with plural substrates supporting the circuit components and the result is typically in oscillator circuit implementation of relatively large dimensions and of relatively high cost. Oscillator circuits alternatively using one of the various kinds of high frequency transistors as the active device can be considered two-port circuits, or can be effectively considered one-port negative resistance circuits using a potentially unstable transistor with an impedance forcing it to operate in an unstable region often also using positive feedback to further destable that device. The present invention involves such a transistor based oscillator circuit because of the suitability thereof in forming such a circuit in a monolithic integrated circuit chip using a semi-insulating gallium arsenide (GaAs)

substrate to both reduce the physical size of the circuit so implemented and the cost of fabrication. Indium phosphide or other high mobility semiconductor material substrate can alternatively be used instead of GaAs.

Figure 1:
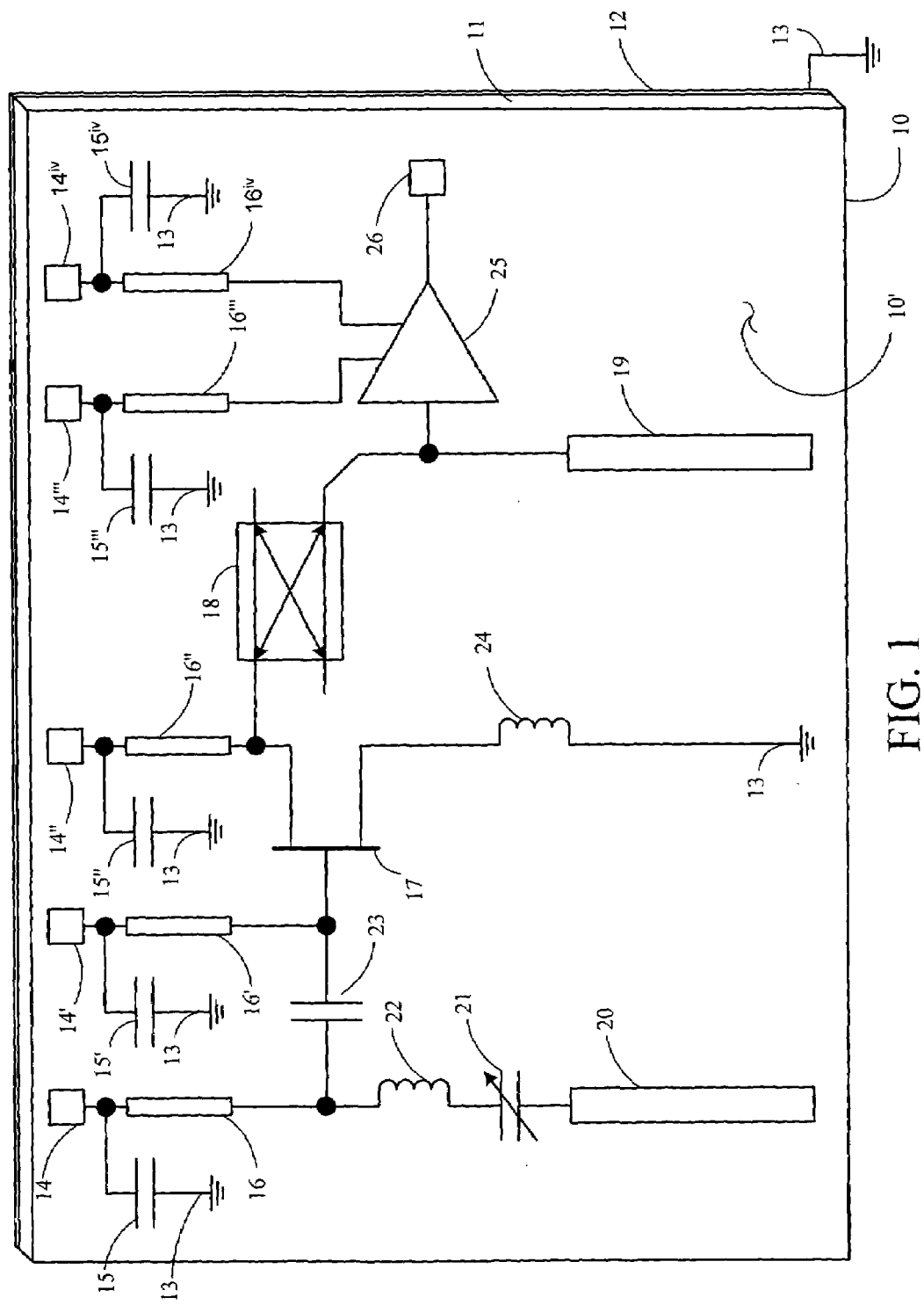
FIG. 1 shows a schematic component layout and component interconnection diagram with a schematic representation of a monolithic integrated circuit chip together embodying the present invention.
Figure 2:
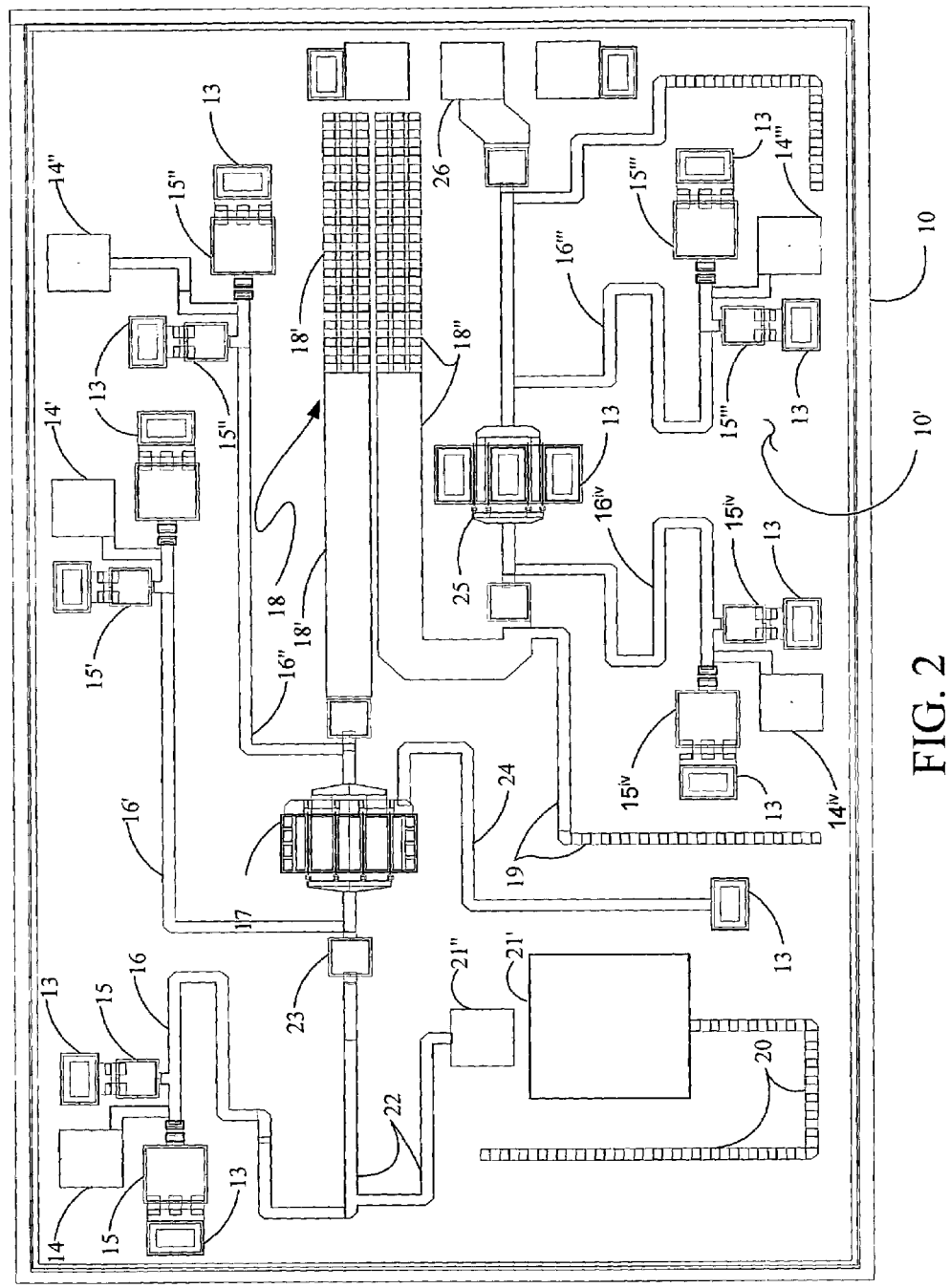
FIG. 2 shows a top view of a monolithic microwave integrated circuit chip corresponding to FIG. 1.

FIG. 1 shows a schematic component layout and component interconnection diagram used with a schematic representation of a monolithic integrated circuit chip, 10, to form the oscillator system of the present invention. FIG. 2 shows a top view of the monolithic integrated circuit chip 10 in a possible physical layout of the oscillator system implemented in a GaAs based chip. Chip 10 forms the substrate for the circuit components and component interconnections made thereon and therein. This substrate comprises a 100 μm thick layer, 11, of GaAs material typically exhibiting a relative dielectric constant or permativity value of 12.9 and a loss tangent value of $6 \times 10^{-4}$.

A ground plane conductive layer, 12, is formed on the back side of GaAs layer 11 so that an unseen equipotential surface is provided as the back side major surface of GaAs layer 11 opposite the operating surface, 10', thereof. This conductive layer is formed by first providing a very thin layer of titanium on the surface for its adhesion properties covered by a very thin layer of platinum to prevent diffusion of the next layer thereon which is a layer of gold that resists well deterioration due to chemical attack in the environment. Layer 12, shown only in FIG. 1, is also indicated to be at a ground potential through the ground indicator symbol, 13, shown in that figure. Other connections to ground plane 13 formed by metallization interconnects through via openings in layer 11 are also marked with the designation 13.

Electrical power is provided to the oscillator circuit portion of the oscillator system of chip 10 at each of several metallic gold voltage supply pads, 14, 14', 14", 14''' and $14^{iv}$, on operating surface 10'. Decoupling networks are used in connection with each of these voltage supply pads to both (a) prevent oscillatory electrical signals occurring in the oscillator system of chip 10 from being introduced into those typically used constant polarity, regulated voltage power supplies electrically connected to these pads, and to (b) prevent rapid voltage value disturbances or power supply noise from being coupled from such voltage power supplies into the oscillator system of chip 10. Thus, any such voltage value disturbances emanating from those power supplies are shunted to ground by a corresponding capacitor that is formed at operating surface 10', and that is connected between the corresponding one of voltage supply pads 14', 14", 14''' and $14^{iv}$ and ground, these being capacitors 15, 15', 15", 15''' and $15^{iv}$, respectively. Each of these voltage supply pad capacitors is split into two separate, parallel connected capacitors for fabrication convenience.

In addition, there are formed on operating surface 10' four relatively long metallic gold interconnection transmission line, 16, 16', 16", 16''' and $16^{iv}$, that each extends from a corresponding one of voltage supply pads 14', 14", 14''' and $14^{iv}$ that effectively behave as inductors at high frequencies so as to provide a high frequency signal block between the oscillator circuit of chip 10 and those voltage power supplies electrically connected to the voltage supply pads. All of the other interconnection structures shown in these figures are also formed of layers of titanium, platinum and gold (Ti/Pt/Au).

Electrical power Ti/Pt/Au to operate the oscillator circuit portion of the oscillator system shown in these figures is supplied typically by regulated voltage power supplies having supply voltage outputs electrically connected to voltage supply pads 14, 14' and 14". This oscillator circuit is based inactive three terminal transistor device, 17, provided here by a pseudomorphic high electron mobility transistor (PHEMT) having a gate, drain and source, and a primary resonant frequency determiner provided here by a strip line coupler, 18, serving as a directional coupler. Coupler 18 has an oblong input microstrip conductor thereof, 18', electrically connected to the drain of PHEMT 17. A further oblong output microstrip conductor, 18", is provided parallel, and closely adjacent, to input conductor 18' to permit the coupling of high frequency signals from input conductor 18' to output conductor 18" but to also prevent zero frequency currents from passing between them.

The remainder of the feedback path in the oscillator circuit from the drain of PHEMT 17 to the gate thereof is provided by a pair of oblong Ti/Pt/Au conductors formed on operating surface 10' to together serve as a pair of microstrip transmission line segments, 19 and 20, with microstrip transmission line segment 19 being electrically connected to output microstrip conductor 18" of strip line coupler 18. Microstrip transmission line segment 19 is formed of an initial continuous strip of Ti/Pt/Au which is extended by a sequence of interconnected Ti/Pt/Au line pads otherwise separated from one another. The interconnection of these Ti/Pt/Au line pads is provided by an elevated gold continuous conductor thereover interconnecting each line pad to the next and to the initial continuous strip to thereby form a composite oblong conductor. Such a sequence of line pads interconnected by an elevated conductor is termed an air bridge line or conductor, and is used to allow the elevated line interconnections between each line pad to be conveniently broken, or otherwise removed, to thereby also remove the line pads on the further side of the break in the elevated conductor from the oblong composite conductor forming microstrip transmission line segment 19, and so thereby shorten same.

Microstrip transmission line segment 20 is, on the other hand, formed entirely of an air bridge line or conductor, i.e. formed entirely of otherwise separated Ti/Pt/Au line pads that are interconnected by an elevated continuous gold conductor to form an oblong conductor. One end of microstrip transmission line segment 20 is interconnected to a varactor, 21, in FIG. 1. In FIG. 2, microstrip transmission line segment 20 is connected to a Ti/Pt/Au mounting pad, 21', which is spaced apart from a further Ti/Pt/Au varactor interconnection pad, 21". Varactor 21 is not shown in FIG. 2 so these pads can be clearly seen and because it in one implementation is not actually integrated into the structure of integrated circuit chip 10. Varactor 21 in that implementation is, instead, has one side thereof mounted on, and interconnected to, mounting pad 21' with an interconnection extending from the other side thereof to interconnection pad 21". This arrangement will be further described below.

Varactor 21 is connected to an end of an inductor, 22, in FIG. 1 that is formed by an extended Ti/Pt/Au interconnection line shown in FIG. 2 provided on operating surface 10' that is also designated 22 there, an interconnection line that behaves as an inductor at high frequencies. Inductor 22 has that end thereof not connected to varactor 21 coupled to the gate of PHEMT 17 by a coupling capacitor, 23, formed at operating surface 10'. Coupling capacitor 23, in addition to completing the feedback path for signals from the drain of PHEMT 17 to the gate thereof, prevents diversion of the current supplied at voltage supply pads 14 and 14' into the circuit path taken by the other.

Considering the oscillator circuit components in somewhat greater detail, PHEMT 17 is formed on a superlattice buffer layer provided on operating surface 10' comprising alternating layers of GaAs and AlGaAs that is formed by using molecular beam epitaxy at relatively high temperatures to thereby minimize the electron-hole pair generation-recombination noise and to reduce flicker or 1/f noise. The remainder of PHEMT 17 is formed thereon from a layer of intrinsic GaAs followed by a layer of AlGaAs but with a GaInAs spike channel having, through doping, n-type conductivity material above and below it formed at the hetrojunction with indium being present in a mole fraction greater than 25%. PHEMT 17 is chosen to have a gate lengths of 0.25 µm or less with a total gate width of 400 µm separated into four gate fingers each 100 µm wide to have a unilateral power gain cutoff frequency $f_{max}$ of 80 GHz or more. Voltage supply pads 14' and 14" provide the bias voltages to the gate and the drain, respectively, of PHEMT 17 to determine its operating point on its performance characteristics, and these voltages can varied within limits to change to some degree the operating point and so the region of instability of PHEMT 17.

An equivalent inductor, 24, provides an inductance between the source of PHEMT 17 and ground in FIG. 1 is realized as shown in FIG. 2 by using a high impedance microstrip transmission line segment, also designated 24, formed of a continuous strip of Ti/Pt/Au. This inductor will in effect be reflected as a noiseless resistor in series with the gate of PHEMT 17 which aids in eliminating any possible transients that may occur in operation of this transistor other than the desired frequency signal, and so stabilize the oscillation frequency of the oscillator circuit.

Coupler 18, although termed a strip line coupler above, is actually formed as indicated there of two parallel continuous Ti/Pt/Au microstrip lines or conductors each having width of about 70 µm and a constant closest separation distance over most of their lengths equal to about 10 µm. In addition, the length of input conductor 18' and the length of output conductor 18" are each extended, starting across from one another at the same point, and added distance by the use of air bridges to connect the sequence of Ti/Pt/Au line pads again separated from one another but having an elevated gold line thereover interconnecting each to the next and to the initial continuous conductor. The length of the continuous conductor portion and the air bridge portion of input conductor 18', and the length of initial continuous portion and the air bridge portion of output conductor 18", along each where they are separated from one another by a constant closest distance, i.e. the maximum coupled region length, are both about 920 µm.

This arrangement provides a −10 db coupler at the midband wavelength of the coupled wavelengths, and that mid-band wavelength is set by the coupled region length which will be a quarter of the mid-band wavelength. Since the coupling factor is a relatively strongly peaked factor at the mid-band wavelength, the mid-band wavelength determined by the coupled region length selected for coupler input conductor 18' and coupler output conductor 18" will set the resonant frequency for the equivalent parallel resonance circuit that is presented to the rest of the oscillator circuit by coupler 18. Thus, removing some of the line pads from the end of the air bridges in each of coupler input conductor 18' and coupler output conductor 18", through breaking or removing the elevated conductor connecting them to the remaining air bridges electrically interconnected with the initial continuous conductors in each, will increase the mid-band wavelength and the resonant frequency of coupler 18.

Microstrip transmission line segment 19, connected to coupler output conductor 18", and formed as a composite oblong conductor will, if chosen to be of the same length as coupler input conductor 18' and coupler output conductor 18", also then have a length equal to a quarter of the wavelength at which coupler 18 is resonant. Since microstrip transmission line segment 19, at the end opposite the one connected to coupler output conductor 18", has no connection to any other component across operating surface 10', that microstrip transmission line is an open circuit at this end. Quarter wavelength microstrip transmission lines with an open circuit termination there act as a short circuit to ground at the input thereof for the signal frequency corresponding to the full wavelength, and so microstrip transmission line segment 19 provides an effective grounding for the output of coupler 18. This will always be true if microstrip transmission line segment 19 is initially also chosen to be 920 µm, and the same number of line pads is removed from the length thereof as are removed from the lengths of coupler input conductor 18' and coupler output conductor 18" whenever any such removals therefrom are made.

Figure 4:
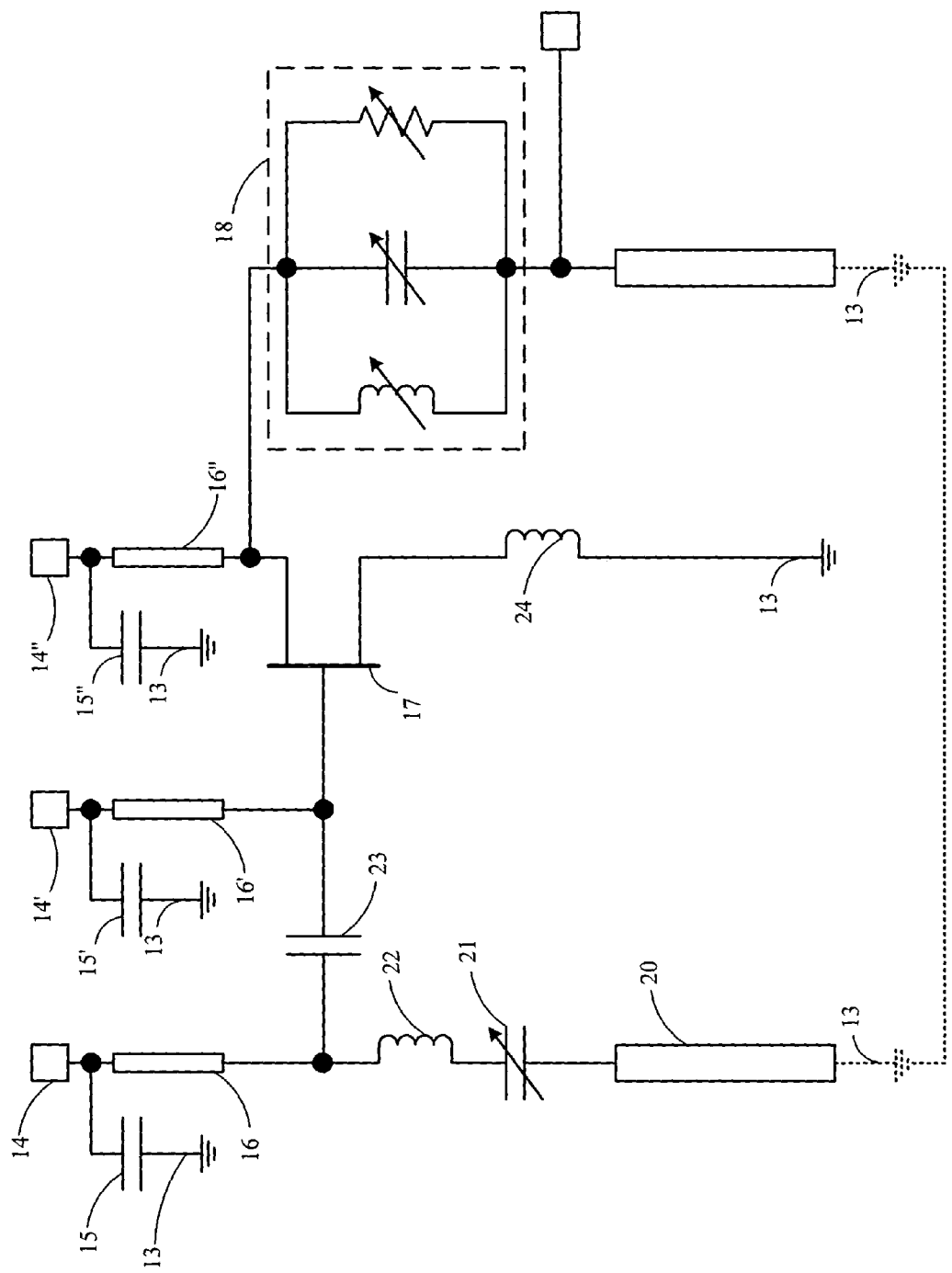
FIG. 4 shows an equivalent operating circuit for the monolithic microwave integrated circuit of FIG. 2.

Microstrip transmission line segment 20 can also be made to be of the same length as microstrip transmission line segment 19 and both coupler input conductor 18' and coupler output conductor 18" in view of it being constructed entirely as an air bridges arrangement of line pads and an elevated continuous conductor interconnecting them. Also, microstrip transmission line segment 20 has the end thereof not connected to varactor mounting pad 21' free of any connection across operating surface 10' to any other circuit component on that surface. Together, microstrip transmission line segment 19 and microstrip transmission line segment 20 form transfer system as a portion of the high frequency feedback path that apparently passes through ground. A positive high frequency feedback path from the drain of PHEMT 17 to the gate thereof, which is one of the requirements for stable oscillator design, is established through this ground path using these open circuited quarter wave microstrip transmission line segments while maintaining isolation between the drain and the gate for very low frequency signals. An effective schematic diagram of this feedback path is shown in FIG. 4 which also has a parallel resonant circuit shown there for coupler 18 in which the circuit symbols for resistance, capacitance and inductance are shown to be variable in view of the air bridges making possible the shortening of the lengths of both coupler input conductor 18' and coupler output conductor 18" (aided in being effective by the concurrent shortening and matching of lengths of microstrip transmission line segments 19 and 20).

Varactor diode 21, mounted in practice on mounting pad 21' and having a wire bond to interconnection pad 21" on chip 10 in FIG. 2, is, in one implementation, fabricated elsewhere and then attached to those pads using conductive silver epoxy or solder to configure the oscillator circuit as a voltage controlled oscillator. Of course, substituting a capacitor for varactor 21 would allow the oscillator circuit to operate as a fixed frequency oscillator since the varactor, or such a capacitor, provides much of the reactance in series with the effective resonant circuit in the feedback path from the drain of PHEMT 17 to the gate thereof to provide positive feedback and so assure circuit oscillation.

Varactor diode 21 is typically selected such that the junction capacitance thereof varies somewhere in a substantial portion of the range of from about 0.3 pF to about 1 pF in response to changing values of an applied diode junction reverse bias voltage. One typical varactor diode used with chip 10 has the diode junction capacitance changes occur in a range from 0.3 pF to 0.8 pF in accord with a diode junction reverse bias voltage changes in a range of 0.0 to −12.0 V.

Voltage supply pad 14 is electrically connected in use to a voltage source having selectable output voltage value that is provided through this pad to reverse bias the diode junction of varactor diode 21 thereby changing the capacitance value thereof, and so the capacitance value present in the effective resonant circuit provided in the feedback path form the drain of PHEMT 17 to the gate thereof and, hence, the resonant frequency of the oscillator circuit. Thus, the frequency of oscillation in the oscillator circuit can be controlled with the value of applied voltage provided on voltage supply pad 14 resulting in a tuning frequency range greater than 1 GHz.

Figure 3:
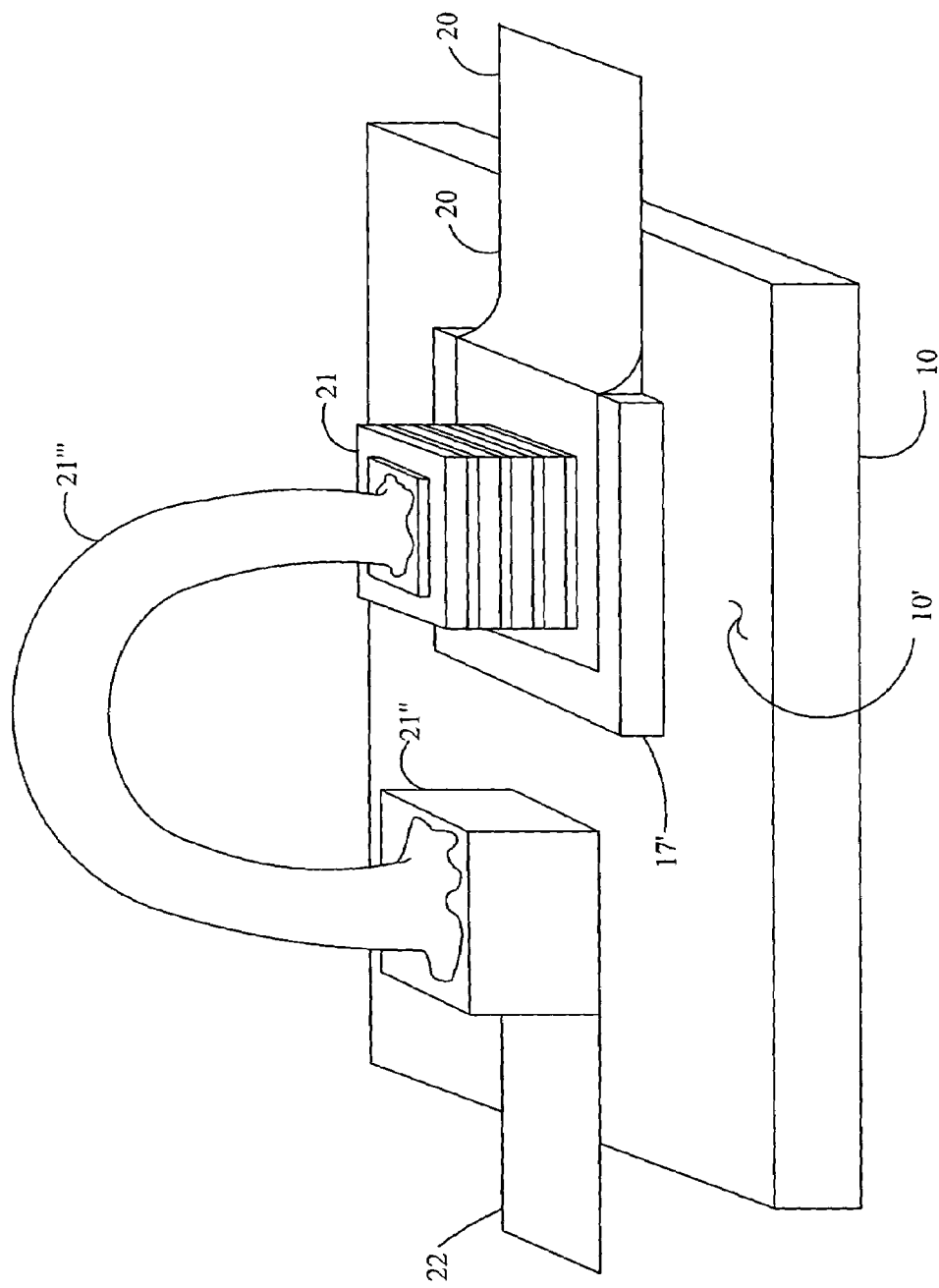
FIG. 3 shows a schematic perspective view of a component and component mounting arrangement for use with the monolithic microwave integrated circuit of FIG. 2.

As an alternative, varactor diode 21 can be provided in another implementation thereof as an integrated varactor diode formed on chip 10 in connection with the formation of PHEMT 17 with the result being illustrated in the schematic perspective view thereof provided in FIG. 3. The same semiconductor material sequence of layers is provided to form a base at the location of the integrated varactor by molecular beam epitaxy as is provided for PHEMT 17. An etch stop layer is used after these layers are provided in forming the desired remaining portions of this semiconductor material sequence to be used for each PHEMT followed by etching the remaining exposed portions of the semiconductor material sequence, and such a portion is also provided to be used as the base for the varactor to be formed upon which is designated in FIG. 3 as a semiconductor base, 17'. The Ti/Pt/Au metal layer sequence is provided over the remaining portion of the etch stop on base 17' and patterned to provide interconnection 20 (as well as interconnection 22). Varactor 21 is then formed with similar methods on the portion of interconnection 20 positioned on the etch stop over base 17' as a hyperabrupt diode junction. A contact pad is provided on the upper surface of varactor 21 as is interconnection pad 21", and an air bridge, 21''', is formed between them. More details concerning the structure of varactor 21 so fabricated are disclosed in U.S. Pat. No. 6,060,962 which is incorporated herein by reference. The noise and the phase contribution from the varactor diode on the overall output signal is negligible and does not affect the overall performance of the oscillator circuit.

Returning to FIGS. 1 and 2, the output voltage signal from the oscillator circuit is taken from the interconnection between coupler output conductor 18" of coupler 18 and microstrip transmission line segment 19, and applied to the input of an amplifier, 25, in the buffer amplification and impedance matching output circuit in the oscillation system provided on chip 10. Amplifier 25 is shown provided by a further PHEMT also designated 25 in FIG. 2. PHEMT 25 is fabricated concurrently with, and in the same manner as, PHEMT 17 with the same gate length but is chosen to have a total gate width of 300 μm separated into two gate fingers each 150 μm wide to also have a unilateral power gain cutoff frequency $f_{max}$ of 80 Ghz. Voltage supply pads 14''' and 14$^{iv}$ provide the bias voltages to the drain and the gate, respectively, of PHEMT 25 to determine its operating point on its performance characteristics.

The drain of PHEMT 25 is connected to a signal output pad, 26, as the location to obtain the output signal of the oscillation system. A microstrip transmission line impedance matching segment, 27, is also shown in FIG. 2 connected to signal output pad 26 and is again formed of an initial continuous strip of Ti/Pt/Au which is extended by a sequence an air bridge of interconnected Ti/Pt/Au line pads otherwise separated from one another. The interconnection of these Ti/Pt/Au line pads is again provided by an elevated gold continuous conductor thereover interconnecting each line pad to the next and to the initial continuous strip to thereby form a composite oblong conductor. Removing the line pads on the further side of a break in the elevated conductor from the oblong composite conductor forming microstrip transmission line impedance matching segment 27 shortens same to allow the output of the oscillator system to be impedance matched with whatever further circuit is electrically connected to signal output pad 26 in its use as part of a larger system. This need not be present in many system interconnection situations and so has not been shown in FIG. 1.

The buffer amplifier circuit provide by PHEMT 25 of the oscillator system of chip 10 will amplify the output signal coupled from the oscillator circuit thereto by coupler 18, and will aid in providing a good impedance matching circuit with the next stage of any larger system in which it is used. Buffer amplifier is provided with a high input impedance and a low output impedance, and so will transform the high impedance presented by the oscillator circuit output to a characteristic impedance of 50 Ω for easy use with typical 50 Ω communication systems. However, buffer amplifier 25 of the oscillator system as implemented in FIG. 2 is not capable of a high gain or a high power output.

(A coupling capacitor without a corresponding numerical identifier is shown provided in FIG. 2 connected between the drain of PHEMT 17 and coupler input conductor 18' of coupler 18, and another such coupling capacitor without a corresponding numerical identifier is shown there connected between the input of amplifier 25 and the interconnection between coupler output conductor 18" of coupler 18 and microstrip transmission line segment 19. A further such coupling capacitor is shown there connected between drain of PHEMT 25 and signal output pad 26. These coupling capacitors are provided with chip 10 for chip design flexibility and evaluation reasons, but are unnecessary for operation of the oscillator system. Thus, they in the first two instances could be replaced by short circuiting interconnections because coupler 18 prevents low frequency voltages and current from passing therethrough. The coupling capacitor in the last instance could also be replaced by a short circuiting interconnection if the low frequency voltages and currents occurring at the drain of PHEMT 25 will not be coupled to whatever further system is connected to signal output pad 26 in using the oscillator system of chip 10 in a larger system. Hence, these coupling capacitors are not shown in FIG. 1.)

The oscillator circuit of chip 10 is arranged so that when there is no mechanical tuning, i.e. when none of the air bridges have been removed, the oscillator transistor circuit, including PHEMT 17 and the associated transistor biasing network, is at the edge of its unstable parameter region in the circuit characteristics within which circuit oscillations can occur with positive feedback. Both of PHEMT 17 and PHEMT 25 are biased to have a drain voltage of ~4V, a drain current of ~130 mA, and a gate voltage of ~0.5V. The oscillator circuit will oscillate at the lowest possible oscillation frequency thereof (~24 GHz) with the greatest lengths being available in, i.e. the longest paths being available through, coupler 18, and through microstrip transmission line segment 19 and microstrip transmission line segment 20 (~920 μm). This situation obviously occurs when none of the air bridges have been removed so that PHEMT 17 and the associated transistor biasing network in the oscillator transistor circuit are at the edge of the unstable parameter region.

If the oscillator circuit is instead mechanically tuned by removing selected ones of these air bridges, the parameters of the oscillator transistor circuit will be placed further into the unstable parameter region to produce greater oscillation frequencies corresponding to the then shortened lengths of coupler 18, microstrip transmission line segment 19 and microstrip transmission line segment 20. There are enough air bridges for each to allow the oscillator transistor circuit to have its parameters changed sufficiently to reach anywhere in the entire unstable parameter region of that circuit where there is potential for circuit oscillations to occur. If all of these air bridges are removed, the oscillator transistor circuit parameters will reach the other edge of the unstable parameter region, and there the oscillator transistor circuit will oscillate at the greatest frequency possible therefor (~40 GHz). Removing one corresponding air bridge from each of coupler 18, microstrip transmission line segment 19 and microstrip transmission line segment 20 will roughly increase the frequency of oscillation of the oscillator circuit by 1 GHz. The oscillator circuit is capable of achieving by such mechanical tuning oscillation frequency changes of more than 15 GHz.

In such mechanical tuning of the oscillator circuit to the different oscillation frequencies provided by this tuning range, coupler 18, microstrip transmission line segment 19 and microstrip transmission line segment 20 should all be tuned in synchronism by removing the corresponding air bridges from each, resulting in the keeping of them at equal lengths and each at quarter wavelength at the frequency of oscillation, to maintain positive feedback between the drain and gate of PHEMT 17, and to effectively maintain the equivalent parallel resonant circuit of coupler 18. Such mechanical tuning will change the RLC parameters of the equivalent circuit shown in FIG. 4 to accordingly resonate at a different frequency. The mechanical tuning will not significantly affect the frequency range available to the oscillator circuit through varying the reverse bias junction voltage applied to varactor diode 21.

Figure 5:
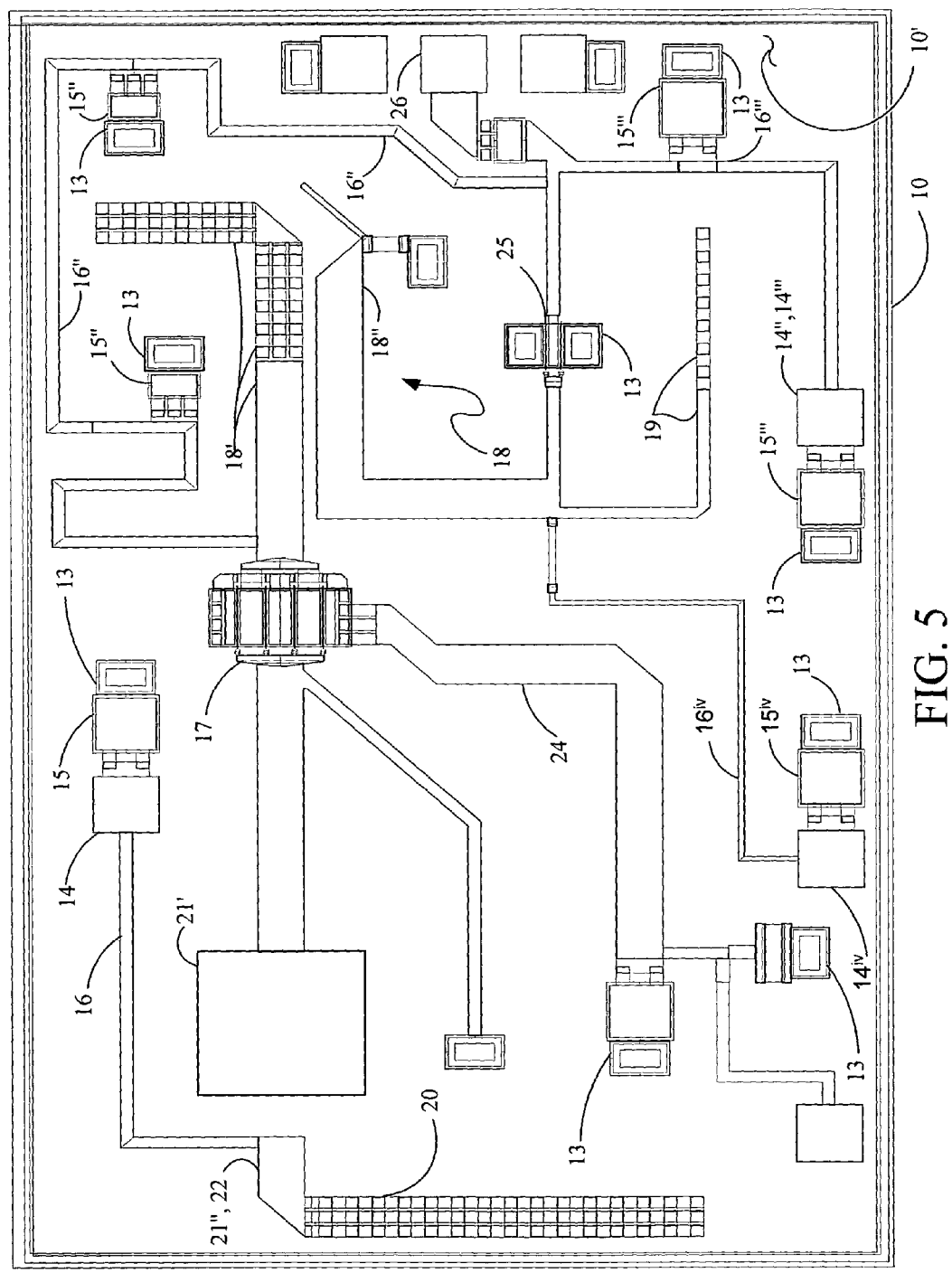
FIG. 5 shows a top view of an alternative monolithic microwave integrated circuit embodying the present invention.

FIG. 5 shows a top view of another version of monolithic integrated circuit chip 10 in another possible physical layout of the oscillator system again implemented in a GaAs based chip suitable for use in a higher frequency band than the one of FIGS. 1 and 2. Wherever appropriate, circuit components and structures in FIG. 5 that are similar to the circuit components and structures in FIG. 2 have the same numerical designations in each of those figures. The version shown in FIG. 5 uses for PHEMT 17 a PHEMT like PHEMT 25 in FIG. 2. A self-biasing scheme is introduced for PHEMT 17. Also, a common drain bias is provided for both PHEMT 17 and PHEMT 25. PHEMT 17 in the FIG. 5 implementation has a potential for oscillations in a higher frequency band than the corresponding PHEMT used in the FIG. 2 implementation, the range here being 24 GHz to 40 GHz. The lengths of coupler 18 and microstrip transmission line segment 19 and microstrip transmission line segment 20 in FIG. 5 are again, of course, chosen to be quarter wavelengths at the potential frequencies of oscillation of the oscillator transistor circuit including PHEMT 17.

Although the present invention has been described with reference to preferred embodiments, workers skilled in the art will recognize that changes may be made in form and detail without departing from the spirit and scope of the invention.

The invention claimed is:

1. A feedback oscillator device formed with an integrated circuit, said device comprising:
   a semiconductor material substrate having a conductive ground plane on an equipotential major surface thereof on a side opposite an operating major surface thereof;
   an amplifier having an input and an output provided at least in part on said semiconductor material substrate at said operating major surface thereof, said amplifier being capable of providing signals at said output thereof representative of signals occurring at said input thereof;
   a coupler having an oblong input conductor of a selected input length provided on said operating major surface of said semiconductor substrate electrically coupled at one end thereof to said amplifier output, and further having an oblong output conductor of a selected output length provided on said operating major surface of said semiconductor substrate closely adjacent to said input conductor with said input conductor over said input length being substantially parallel to said output conductor over said output length, said output conductor being electrically coupled at one end thereof to said amplifier input; and
   a capacitor electrically coupling said coupler output conductor through said capacitor to said amplifier input.

2. The device of claim 1 wherein said semiconductor material substrate is formed of gallium arsenide.

3. The device of claim 1 further comprising a transfer system that, with said capacitor, electrically couples said coupler output conductor to said amplifier input, said transfer system having an oblong input conductor of a selected input length provided on said operating major surface of said semiconductor substrate electrically coupled substantially on said operating major surface at one end thereof to said coupler output conductor but free of other connections on an opposite end thereof to other structures on said operating major surface, and having an oblong output conductor of a selected output length provided on said operating major surface of said semiconductor substrate electrically coupled substantially on said operating major surface at one end thereof to said amplifier input but free of other connections on an opposite end thereof to other structures on said operating major surface.

4. The device of claim 1 wherein said amplifier comprises a transistor formed at least in part in said semiconductor material and having first and second terminating regions and having a control region therein by which it is capable of being directed, by electrical energization thereof, to effectively provide a conductive path of a selected conductivity between said first and second terminating regions, a selected one of said first and second terminating regions being coupled to said amplifier output and said control region being coupled to said amplifier input.

5. The device of claim 1 wherein said coupler input conductor has a continuous portion thereof on said operating major surface electrically coupled at one end thereof to said amplifier output and has an opposite end thereof comprising a sequence of conductive pads on said operating major surface interconnected by at least one elevated conductor having portions between said conductive pads that are relatively easily removable, and wherein said coupler output conductor has a continuous portion thereof on said operating major surface electrically coupled at one end thereof through said capacitor to said amplifier input and has an opposite end thereof comprising a sequence of conductive pads on said operating major surface interconnected by at least one elevated conductor having portions between said conductive pads that are relatively easily removable.

6. The device of claim 1 wherein said capacitor comprises a varactor having a conductor connected thereto through which a low frequency voltage can be further provided across a semiconductor material junction in said varactor.

7. The device of claim 3 further comprising a supplemental amplifier having an input and an output provided at least in part on said semiconductor material substrate at said operating major surface thereof with said supplemental amplifier being capable of providing signals at said output thereof representative of signals occurring at said input thereof, and having said input thereof electrically coupled to both said coupler output conductor and said transfer system input conductor and wherein said capacitor electrically couples said transfer system output conductor to said amplifier input.

8. The device of claim 3 wherein said transfer system input conductor has a continuous portion thereof on said operating major surface electrically coupled at one end thereof to said coupler output conductor and has an opposite end thereof comprising a sequence of conductive pads on said operating major surface interconnected by at least one elevated conductor having portions between said conductive pads that are relatively easily removable, and wherein said transfer system output conductor has a continuous portion thereof on said operating major surface electrically coupled at one end thereof to said amplifier input and has an opposite end thereof comprising a sequence of conductive pads on said operating major surface interconnected by at least one elevated conductor having portions between said conductive pads that are relatively easily removable.

9. The device of claim 4 wherein said semiconductor material substrate is formed of gallium arsenide.

10. The device of claim 4 wherein said transistor is a high electron mobility transistor.

11. The device of claim 4 wherein that remaining one of said first and second terminating regions has an inductance coupled therefrom to said conductive ground plane.

12. The device of claim 5 further comprising a transfer system that, with said capacitor, electrically couples said coupler output conductor to said amplifier input, said transfer system having an oblong input conductor of a selected input length provided on said operating major surface of said semiconductor substrate electrically coupled substantially on said operating major surface at one end thereof to said coupler output conductor but free of other connections on an opposite end thereof to other structures on said operating major surface, and having an oblong output conductor of a selected output length provided on said operating major surface of said semiconductor substrate electrically coupled substantially on said operating major surface at one end thereof to said amplifier input but free of other connections on an opposite end thereof to other structures on said operating major surface, and wherein said transfer system input conductor has a continuous portion thereof on said operating major surface electrically coupled to said continuous portion end of said coupler output conductor and has an opposite end thereof comprising a sequence of conductive pads on said operating major surface interconnected by at least one elevated conductor having portions between said conductive pads that are relatively easily removable, and wherein said transfer system output conductor has a continuous portion thereof on said operating major surface electrically at one end thereof coupled through said capacitor to said amplifier input and has an opposite end thereof comprising a sequence of conductive pads on said operating major surface interconnected by at least one elevated conductor having portions between said conductive pads that are relatively easily removable.

13. The device of claim 10 wherein said transistor is a pseudomorphic high electron mobility transistor.

14. The device of claim 12 further comprising a supplemental amplifier having an input and an output provided at least in part on said semiconductor material substrate at said operating major surface thereof with said supplemental amplifier being capable of providing signals at said output thereof representative of signals occurring at said input thereof, and having said input thereof electrically coupled to both said continuous portion end of said coupler output conductor and said continuous portion end of said transfer system input conductor.

15. The device of claim 14 wherein said capacitor comprises a varactor having a conductor connected thereto through which a low frequency voltage can be further provided across a semiconductor material junction in said varactor.

16. A feedback oscillator device formed with an integrated circuit providing a signal therein with a selected frequency of magnitude oscillation, said device comprising:
a semiconductor material substrate having a conductive ground plane on an equipotential major surface thereof on a side opposite an operating major surface thereof;
an amplifier having an input and an output provided at least in part on said semiconductor material substrate at said operating major surface thereof, said amplifier being capable of providing signals at said output thereof representative of signals occurring at said input thereof; and
a transfer system having an oblong input conductor of a length that is a quarter of that wavelength associated with said frequency of magnitude oscillation and is provided on said operating major surface of said semiconductor substrate electrically coupled substantially on said operating major surface at one end thereof to said amplifier output without any member of any pair of coupled conductors of a different length being provided therebetween and also being free of other connections on an opposite end thereof to other structures on said operating major surface, and having an oblong output conductor of a length that is a quarter of that wavelength associated with said frequency of magnitude oscillation and is provided on said operating major surface of said semiconductor substrate electrically coupled substantially on said operating major surface at one end thereof to said amplifier input without any member of any pair of coupled conductors of a different length being provided therebetween and also being free of other connections on an opposite end thereof to other structures on said operating major surface, said input conductor being spaced apart from said output conductor sufficiently to avoid any substantial electromagnetic coupling therebetween at said operating major surface.

17. The device of claim 16 wherein said semiconductor material substrate is formed of gallium arsenide.

18. The device of claim 16 further comprising a capacitor electrically coupling with said transfer system said amplifier output to said amplifier input.

19. The device of claim 17 wherein said amplifier comprises a transistor formed at least in part in said semiconductor material and having first and second terminating regions and having a control region therein by which it is capable of being directed, by electrical energization thereof, to effectively provide a conductive path of a selected conductivity between said first and second terminating regions, a selected one of said first and second terminating regions being coupled to said amplifier output and said control region being coupled to said amplifier input.

20. The device of claim 16 wherein said transfer system has at least one circuit portion in series therewith having an impedance therein dependent on frequency so as together exhibit an extreme impedance value at a resonant frequency.

21. The device of claim 19 wherein that remaining one of said first and second terminating regions has an inductance coupled therefrom to said conductive ground plane.

22. The device of claim 18 wherein said capacitor comprises a varactor having a conductor connected thereto through which a low frequency voltage can be further provided across a semiconductor material junction in said varactor.

23. The device of claim 1 wherein said coupler output conductor is coupled at one end thereof to said amplifier input without a conductor extending as a connector between them on said operator major surface.

24. The device of claim 1 wherein said coupler input conductor coupled at one end thereof to said amplifier output is free of other connections on an opposite end thereof.

25. The device of claim 1 wherein said selected input length and said selected output length are each a quarter of that wavelength associated with a frequency of magnitude oscillation of a signal in said oscillator device.

26. The device of claim 3 wherein said transfer system input conductor is spaced apart from said transfer system output conductor sufficiently to avoid any substantial electromagnetic coupling therebetween at said operating major surface.

27. The device of claim 7 wherein said coupler input conductor coupled at one end thereof to said amplifier output is free of other connections on an opposite end thereof.

28. The device of claim 3 wherein said selected input and output lengths of said coupler input and output conductors, and said selected input and output lengths of said transfer system input and output conductors, are each a quarter of that wavelength associated with a frequency of magnitude oscillation of a signal in said oscillator device.

29. The device of claim 7 wherein said capacitor and said transfer system have at least one circuit portion in series therewith having an impedance therein dependent on frequency so as together exhibit an extreme impedance value at a resonant frequency.

30. The device of claim 16 wherein said transfer system output conductor is coupled at one end thereof to said amplifier input without a conductor extending as a connector between them on said operator major surface.

31. The device of claim 16 wherein said coupler further comprising a supplemental amplifier having an input and an output provided at least in part on said semiconductor material substrate at said operating major surface thereof with said supplemental amplifier being capable of providing signals at said output thereof representative of signals occurring at said input thereof, and having said input thereof electrically coupled to said transfer system input conductor.

32. The device of claim 18 further comprising an inductor electrically coupling with said capacitor and said transfer system said amplifier output to said amplifier input.

33. he device of claim 19 wherein said transistor is a high electron mobility transistor.

34. The device of claim 29 wherein said transfer system input conductor is spaced apart from said transfer system output conductor sufficiently to avoid any substantial electromagnetic coupling therebetween at said operating major surface, and wherein said selected input and output lengths of said transfer system input and output conductors, are each a quarter of that wavelength associated with a frequency of magnitude oscillation of a signal in said oscillator device.

35. The device of claim 33 wherein said transistor is a pseudomorphic high electron mobility transistor.

36. The device of claim 16 further comprising a coupler that, with said transfer system, electrically couples said amplifier output to said amplifier input, said coupler having an oblong input conductor of a selected input length provided on said operating major surface of said semiconductor substrate electrically coupled substantially on said operating major surface at one end thereof to said amplifier output, and having an oblong output conductor of a selected output length provided on said operating major surface of said semiconductor substrate electrically coupled substantially on said operating major surface at one end thereof to said amplifier input.

37. The device of claim 20 further comprising a coupler in said circuit portion that, with said transfer system, electrically couples said amplifier output to said amplifier input, said coupler having an oblong input conductor of a selected input length provided on said operating major surface of said semiconductor substrate electrically coupled substantially on said operating major surface at one end thereof to said amplifier output, and having an oblong output conductor of a selected output length provided on said operating major surface of said semiconductor substrate electrically coupled substantially on said operating major surface at one end thereof to said amplifier input.

38. The device of claim 32 further comprising a coupler that, with said transfer system, said capacitor and said inductor, electrically couples said amplifier output to said amplifier input, said coupler having an oblong input conductor of a selected input length provided on said operating major surface of said semiconductor substrate electrically coupled substantially on said operating major surface at one end thereof to said amplifier output, and having an oblong output conductor of a selected output length provided on said operating major surface of said semiconductor substrate electrically coupled substantially on said operating major surface at one end thereof to said amplifier input.

39. The device of claim 30 wherein said capacitor comprises a varactor having a conductor connected thereto through which a low frequency voltage can be further provided across a semiconductor material junction in said varactor.

* * * * *